(12) United States Patent
Jerez et al.

(10) Patent No.: US 11,961,696 B1
(45) Date of Patent: Apr. 16, 2024

(54) ION SOURCE CATHODE

(71) Applicant: Ion Technology Solutions, LLC, Mineola, NY (US)

(72) Inventors: Manuel A. Jerez, Rockville Center, NY (US); Carlos F. M. Borges, Roslyn Estates, NY (US); William A. Natoli, Farmingdale, NY (US)

(73) Assignee: ION TECHNOLOGY SOLUTIONS, LLC, Mineola, NY (US)

( * ) Notice: Subject to any disclaimer, the term of this patent is extended or adjusted under 35 U.S.C. 154(b) by 64 days.

(21) Appl. No.: 17/976,068

(22) Filed: Oct. 28, 2022

(51) Int. Cl.
  *H01J 37/08* (2006.01)
  *H01J 37/16* (2006.01)
  *H01J 37/317* (2006.01)

(52) U.S. Cl.
  CPC ............ *H01J 37/08* (2013.01); *H01J 37/165* (2013.01); *H01J 37/3171* (2013.01)

(58) Field of Classification Search
  CPC ....... H01J 37/08; H01J 37/165; H01J 37/3171
  USPC ............................................................ 313/44
  See application file for complete search history.

(56) References Cited

U.S. PATENT DOCUMENTS

| | | | |
|---|---|---|---|
| 8,253,334 B2* | 8/2012 | Jerez ........................ | H01J 37/08 313/352 |
| 10,217,600 B1* | 2/2019 | Borges ..................... | H01J 37/08 |
| 10,468,220 B1* | 11/2019 | Jerez ........................ | H01J 27/18 |
| 2014/0145581 A1* | 5/2014 | Jerez ........................ | H01J 27/08 313/231.41 |
| 2020/0303153 A1* | 9/2020 | Ochi ................. | H01J 37/32788 |

* cited by examiner

*Primary Examiner* — Christopher M Raabe
(74) *Attorney, Agent, or Firm* — Francis C. Hand; Carella, Byrne, et al.

(57) ABSTRACT

The improved cathode sub-assembly includes a solid cylindrical cathode of tungsten, a cylindrical holder concentric to the cathode with an internal radially directed rib receiving one end of the cathode, and a cylindrical reflector threadably mounted within the holder in circumferentially spaced relation to the cathode. The holder is threadably mounted in a support plate to be able to be readily removed for servicing and/or replacement.

13 Claims, 8 Drawing Sheets

US 11,961,696 B1

ION SOURCE CATHODE

FIELD OF THE INVENTION

This invention relates to an ion implanter having an ion generating source with an improved ion source cathode.

BACKGROUND OF THE INVENTION

Ion implantation is a process used to dope impurity ions into a semiconductor substrate. An ion beam is directed from an ion source chamber toward a substrate. The depth of implantation into the substrate is based on the ion implant energy and mass of the ions generated in the source chamber. A precise doping profile in the substrate is critical to proper device operation. One or more types of ion species may be implanted in different doses and at different energy levels to obtain desired device characteristics. During implantation or other workpiece processing, accelerated ions will sputter materials off any impinged surface eroding the surface.

Ion sources that generate the ion beams used in existing implanters are typically called arc ion sources and can include heated filament cathodes for creating ions that are shaped into an appropriate ion beam for wafer treatment. U.S. Pat. No. 5,497,006 (Sferlazzo) includes an ion source having a cathode and anti-cathode (repeller) disposed in a gas confinement chamber. The ion source further includes a solid aluminum block for retaining the gas confinement chamber with a support portion of the base. The cathode of the U.S. Pat. No. 5,497,006 is a tubular conductive body and endcap that partially extends into the gas confinement chamber. A filament is supported within the tubular body and emits electrons that heat the endcap through electron bombardment, thermionically emitting the ionizing electrons into the gas confinement chamber.

U.S. Pat. No. 5,763,890 (Cloutier) also discloses an arc ion source for use in an ion implanter. The ion source includes a gas confinement chamber having conductive chamber walls that bound a gas ionization zone. The gas confinement chamber includes an exit opening to allow an ion beam to exit the chamber.

U.S. Patent Application 2011/0156570 (Jerez) also discloses a cathode assembly for use in an ion implanter. The ion source includes a gas confinement chamber having a filament clamp assembly. The filament clamp assembly has a pair of bifurcate clamps to hold the connecting leads of a filament within a cavity of a cathode of a separate cathode assembly. The filament clamp assembly is mounted on an insulator block in self-aligning relation. The cathode assembly has a tungsten cathode with an internal cavity to receive the filament and is secured within a retainer shield made of tungsten, molybdenum and graphite by a threaded graphite cylindrical collar.

Other sources may drive RF, microwave or electron beam discharges to generate desired ions. These sources generate plasma densities 10-100 times lower than arc ion sources and are typically used with source materials that have low ionization potentials (species that are easy to ionize) or when the source chamber includes large ion extraction areas.

Cold ion sources, such as shown in U.S. Pat. No. 6,975,072 (Leung) can have source materials made of relatively low temperature materials, such as stainless steel, copper or aluminum. Hot sources, such as arc ion sources, expose the source chamber walls to an arc plasma of a temperature of several tens of thousands of degrees Celsius and high thermal power densities which have required source components of prior art implanters to be made of high temperature, so called refractory, materials, such as molybdenum, tantalum or tungsten.

As is known in the art, the connecting leads of a filament are typically captured by a first and second filament clamp. These clamps typically employ a cam operation or setscrew to open integral jaws on the clamps for accepting the filament leads. The leads are in turn held by the spring force developed by the clamping jaws. Due to the extreme temperatures reached by the filament during operation, the clamping jaws will relax over time and take a permanent set. The electrical connection to the filament is thereby compromised and the ion source needs repair or replacement, resulting in repeated and extended periods of downtime for the implanter.

As is known in the art, the cathode and filament clamps are attached to an electricalthermal insulator block. The filament/clamp assembly is typically attached to the insulator block with pan head machine screws. The assembly is positioned such the filament is centrally located within the cavity of the cathode. The pan head machine screws are then tightened to hold the assembly in place. The proper position of the filament depends on the skill of the operator and/or the need to employ an assembly fixture. Improper assembly will result in an electric short between the filament and cathode rendering the ion source in-operable. A minimum gap between the filament and cathode must also be met to ensure maximum life expectancy for the ion source.

Accordingly, it is an object of the invention to provide an ion source cathode that improves the life performance during ion beam operation and uses less parts to assemble.

It is another object of the invention to provide an improved ion source cathode structure for ion implanters to improve the ion implanter lifetime, reduce the number of parts and reduce ion implanter downtime.

It is another object of the invention to minimize heat loss and keep a high temperature on a cathode surface thereby improving the thermal electrons emissions to ionize the containing gases inside of an arc chamber of an ion implanter.

SUMMARY OF THE INVENTION

Briefly, the invention provides an indirectly heated cathode ion source assembly for use in creating a stream of ions.

The assembly includes a cathode sub-assembly for use with an ion source for generating a beam of ions and a filament coaxially disposed within the cathode sub-assembly.

The cathode sub-assembly for the ion implanter comprises a cylindrical cathode, a cylindrical holder concentric to the cathode, and a cylindrical reflector threadably mounted within the holder in circumferentially spaced relation to the cathode. In addition, the holder has an internal radially directed rib receiving one end of the cathode in slidable relation.

The cathode is of solid construction and is made of tungsten.

In addition, the internal rib of the holder has three circumferentially spaced slots while one end of the cathode is circumferentially recessed relative to the remainder of the cathode and has three upstanding tabs slidably received in the slots of the internal rib of the holder while the remainder of the recessed periphery is radially spaced from the holder. The three tabs function as thermal contact points to characterize the cathode as a three-point cathode. The limited contact area between the cathode and the holder serves to reduce the thermal transfer (thermal loss) from the cathode to the holder thereby keeping the surface temperature of the cathode at a high level in order to improve electron emission.

Alternatively, in a situation where the cathode surface temperature would be high enough to cause some instability on the cathode bias voltage, the end of the cathode may be leveled to provide a full circumferential contact surface. This construction increases the contact area between the cathode and the holder and serves to increase the thermal transfer from the cathode to the holder thereby reducing the surface temperature of the cathode.

The cylindrical reflector serves to prevent thermal loss from the cathode thereby improving the surface temperature of the cathode surface.

The filament has an end of flattened serpentine shape facing one end of the cathode for emitting thermionic electrons onto the cathode and a pair of parallel leads extending from the end of flattened serpentine shape.

In addition, a cylindrical thermal shield is positioned concentrically of the filament to reduce thermal loss. The thermal shield has a flat face facing the end of flattened serpentine shape of the filament in spaced relation to reflect the thermionic electrons emitted from the filament towards the cathode. The thermal shield has a tubular part that acts as a thermal break liner to minimize thermal losses and to maintain a high temperature in the region of the filament thereby enhancing the cathode surface temperature.

The cathode sub-assembly is mounted on a graphite support plate. To this end, the cylindrical holder is threadably mounted in and projects from the support plate. In this manner, the cathode sub-assembly may be easily removed for servicing or replacement in an ion implanter.

The leads of the filament also pass through the support plate and pass into the interior of the holder.

The thermal shield positioned about the filament is also mounted on the support plate and passes into the interior of the holder.

The tri-point contact characteristic of the cathode sub-assembly is also intended to minimize heat transfer from the cathode holder to the support plate.

The cathode, preferably constructed from tungsten, is designed to achieve a very high temperature, e.g. 2700° C. (2,973.15 K), to maximize the thermal electron emission.

The invention also provides an improved ion source for generating an ion beam. This ion source comprises an arc discharge chamber of box-like shape having a pair of opposed walls at least one of which has an opening, a cover disposed on the chamber with a slit for passage of an ion beam therethrough; a cylindrical graphite liner disposed in the wall opening and a cathode assembly disposed within the liner for emitting electrons into the chamber.

In accordance with the invention, the graphite liner has a circumferential shoulder at one end in contact with the wall of the discharge chamber and a cylindrical surface in circumferentially spaced relation to the wall to define a gap therebetween to preserve the cathode temperature. This graphite liner functions as the electrical insulation between the arc discharge chamber and the cathode thereby reducing the thermal loss from the cathode.

Also, in accordance with the invention, the cover has a recessed central area and a pair of raised thermal contacts at each corner of the recessed central area in order to receive a graphite heat shield thereon. The arc discharge chamber is also recessed with a pair of raised thermal contacts at each corner to receive the graphite heat shield thereon. In this way, the heat shield is spaced from the cover and the arc chamber to decrease the mutual contact area between the cover and chamber.

The arc discharge chamber also has a pair of raised contact ribs on each of the walls of the chamber to contact and space a graphite heat shield from the respective wall. Likewise, the bottom of the arc discharge chamber has upstanding contacts to space a graphite heart shield form the bottom.

BRIEF DESCRIPTION OF THE DRAWINGS

These and other objects and advantages of the invention will become more apparent from the following detailed description taken in conjunction with the drawings wherein.

DETAILED DESCRIPTION OF THE INVENTION

Figure 1:
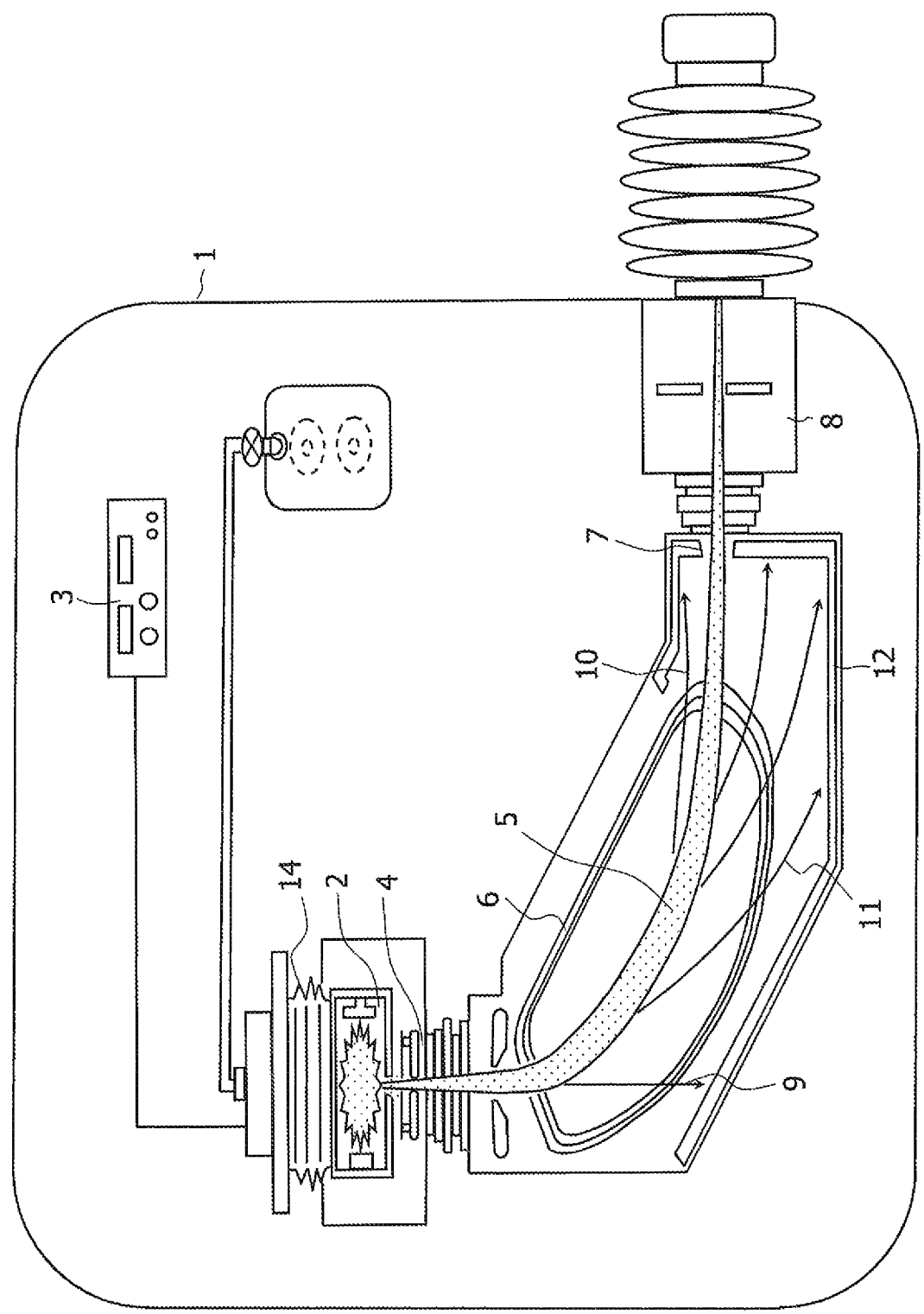
FIG. 1 illustrates a block diagram of an ion implanter of conventional construction.

Referring to FIG. 1, a conventional ion beam implanter 1 includes an ion source 2 for creating ions that form an ion beam 5 which is shaped and selectively deflected to traverse a beam path to an end or implantation station.

The ion source 2 is powered by an extraction power supply 3 and includes a plasma chamber defining an interior region into which source materials are injected. The source materials may include an ionizable gas or vaporized source material. Ions generated within the plasma chamber are extracted from the chamber by ion beam extraction assembly 4 which includes a number of metallic electrodes for creating an ion accelerating electric field.

Subsequent to the beam extraction 4, the beam 5 passes through a mass analyzer 6. The mass analyzer 6 is configured with a particular magnetic field such that only the ions with a desired mass-to-charge ratio are able to travel through the analyzer 6 for maximum transmission through a mass resolving slit 7. Ions of the desired species pass from the mass slit 7 through a deceleration stage 8. The neutral 9, lighter 10 and heavy 11 ions will be deposited on graphite walls 12 inside of the mass analyzer 6.

An indirectly heated cathode (IHC) ion source is typically used as the ion source chamber in high current applications.

Figure 2:
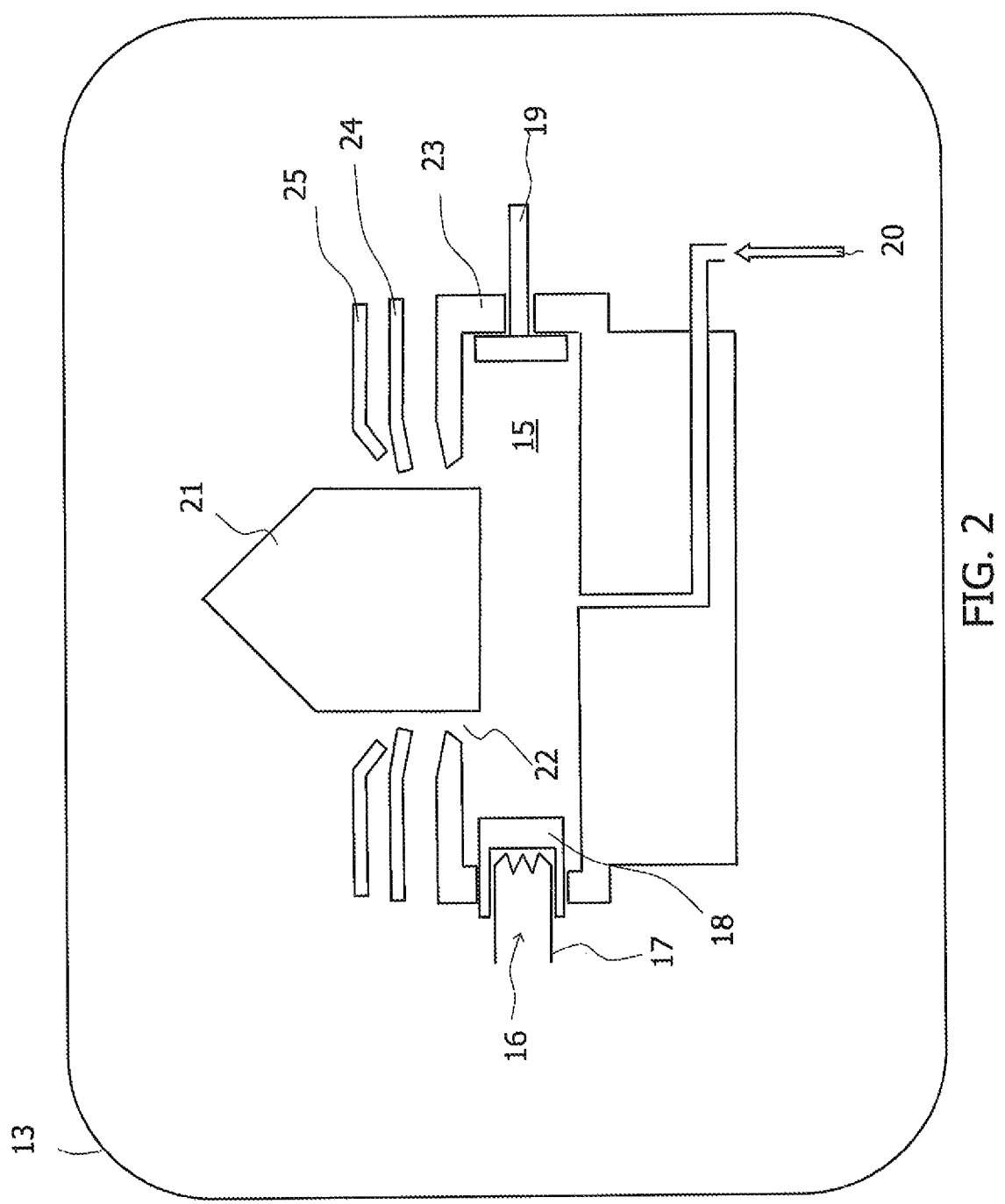
FIG. 2 illustrates a schematic of a conventional ion source in an ion implanter.

Referring to FIG. 2, a typical indirectly heated cathode (IHC) ion source 13 includes an arc chamber 15 defined by electrically conductive (e.g. tungsten) chamber walls. The chamber 15 defines an ionization zone within which energy is imparted to a dopant feed gas to generate associated ions. Different feed gases are supplied to the ion source chamber 15 to obtain plasma used to form ion beams having particular dopant characteristics. For example, the introduction of $H_2$, $BF_3$, $GeF_4$, $PH_3$, and $AsH_3$ as the dopant gas at relatively high chamber temperatures are broken down into mono-atoms having low, medium and high implant energies. These ions are formed into a beam, which then passes through a source filter. The source filter is preferably located near the ion source. The ions within the beam are accelerated/decelerated in column to the desired energy level. A mass analyzer magnet having an aperture is used to remove unwanted components from the ion beam, resulting in an ion beam having the desired energy and mass characteristics passing through resolving aperture.

The IHC ion source 13 includes a cathode/filament assembly 16 located at one end of the arc chamber 15 wherein a filament 17 is positioned in close proximity to a cathode 18 inside the arc chamber 15. A voltage is supplied to the filament 17 which produces enough current through the filament 17 to heat the filament and cause a thermionic emission of electrons. The cathode 18 is indirectly heated via the filament 17 by biasing the cathode 18 more positively than the filament 17 which causes these thermo-electrons to accelerate from the filament 17 toward the cathode 18, thereby heating the cathode 18.

A repeller 19 is typically positioned on the opposite end of the arc chamber 15 and is biased to the same voltage as the cathode 18. The emitted electrons are confined between the cathode 18 and the repeller 19 which collide with a dopant feed gas introduced into the chamber via a conduit 20 to generate a plasma having the desired properties.

The ions formed from the dopant gas are extracted from the source chamber 15 as a beam 21 via an aperture 22 by way of, for example, a standard three (3) electrode configuration comprising plasma electrode 23, suppression electrode 24 and ground electrode 25 used to create and electric field. Although the suppression electrode 24 is shown as being spaced apart from the ground electrode 25, this is for illustrative purposes only and the electrodes are physically in contact with each other via insulators. The plasma electrode 23 may be biased at the same large potential as the ion source chamber 15. The suppression electrode 24 is connected to a power supply and is typically biased at a moderate negative value to prevent electrons from entering back into the source chamber 15. The ground electrode 25 is positioned downstream from the suppression electrode 24 and is a ground potential. The strength of the electric field generated by the electrodes can be tuned to a desired beam current to extract a particular type of ion beam 21 from the ions generated in the arc chamber 15.

Referring to FIG. 1, a source bushing 14 may be coupled between the ion source 2 and other components of the ion implanter, such as a vacuum vessel.

The two termini of the bushing 14 are maintained at different electrical potentials. The ion source 2 may be energized to a high extraction potential around 80 kV in some instances and even higher in other instances by the extraction power supply 3. The other terminus of the source bushing 14 may be coupled to a component at ground potential. Advantageously, the source bushing 14] is configured with an aluminum shielding to trap the metallic material (electrically conductive film), such as a tungsten film, on the source bushing 14] to avoid electrical breakdown of the source bushing.

Figure 3:
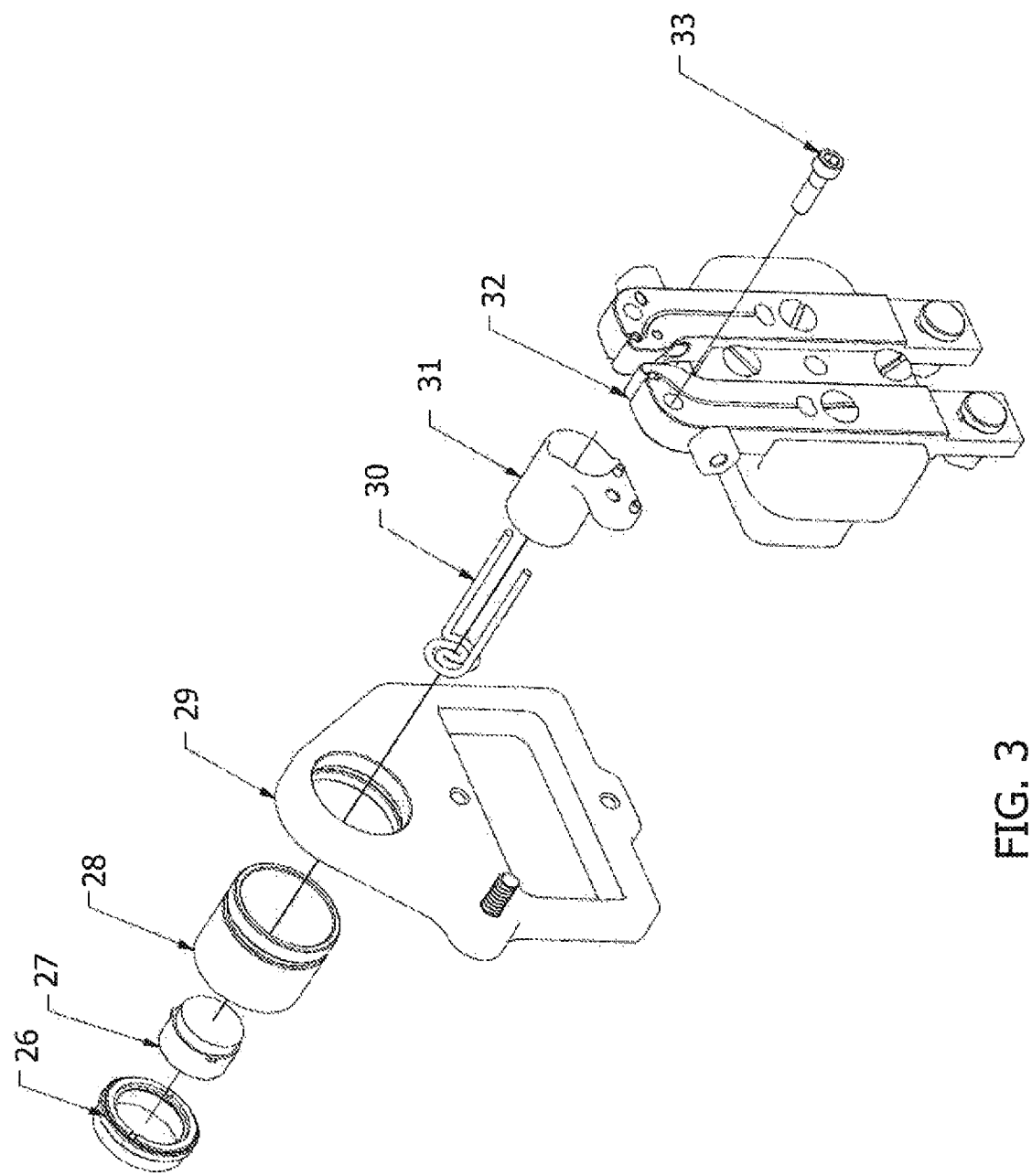
FIG. 3 illustrates an exploded view of an indirectly heated cathode ion source in accordance with the invention.

Referring to FIG. 3, the improved ion source cathode of the invention includes a cathode assembly comprising a cylindrical cathode 27, a cylindrical holder 28 concentric to the cathode 27 and a cylindrical reflector 26 threadably mounted within the holder 28 in circumferentially spaced relation to the cathode 27. (see FIG. 6)

Figure 6:
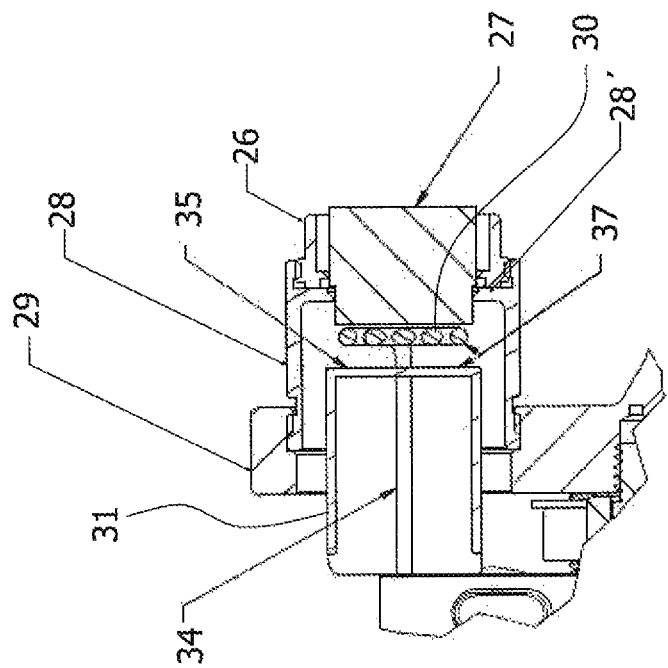
FIG. 6 illustrates an enlarged sectional view of FIG. 5.

Referring to FIG. 6, the cathode 27 is of solid construction and is made of tungsten. In addition, one end of the cathode 27 is circumferentially recessed relative to the remainder of the cathode and the holder 28 has an internal radially directed rib 28' receiving the recessed end of the cathode 27 in slidable relation.

The holder 28 serves as a thermal shield about the cathode 27.

Figure 8:
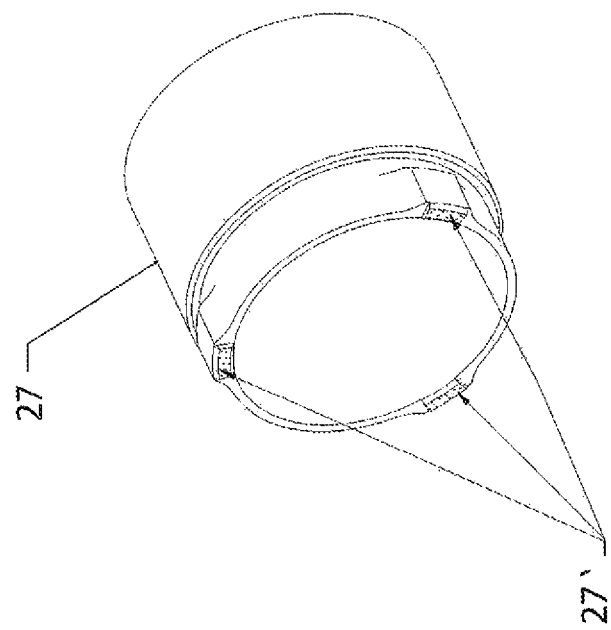
FIG. 8 illustrates a cathode of the invention with a tri-point contact.

Referring to FIG. 8, the cathode 27 has three upstanding tabs 27' circumferentially spaced apart on the recessed end that are slidably received in slots (not shown) in the holder 28. The remainder of the recessed end of the cathode 27 is radially spaced from the holder 28. These tabs 27' provide thermal contact points between the cathode 27 and the holder 28 to characterize the cathode 27 as a tri-point cathode 27.

The cylindrical threated reflector 26, integrated with the tri-point contact cathode 27 and the cylindrical cathode holder and thermal shield 28 will prevent thermal loss to improve the surface temperature on the surface of the cathode 27.

Referring to FIGS. 3 and 6, the cathode assembly is mounted in a graphite support plate 29 by threading of an end of the holder 28 into an internally threaded aperture of the support plate 29.

As illustrated, a tungsten filament 30 passes through the support plate 29 and has an end of flattened serpentine shape facing the end of the cathode 27 (FIG. 6) for emitting thermionic electrons onto the cathode 27. The filament 30 has a pair of parallel leads 34 extending from the end of flattened serpentine shape.

In addition, a cylindrical tubular reflector 31 surrounds the filament legs and passes through the support plate 29 and into the holder 28 to function as a thermal shield.

Figure 5:
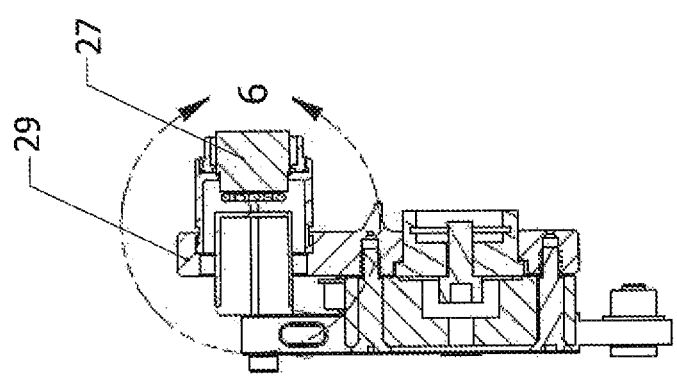
FIG. 5 illustrates a view taken on line 5-5 of FIG. 4.
Figure 4:
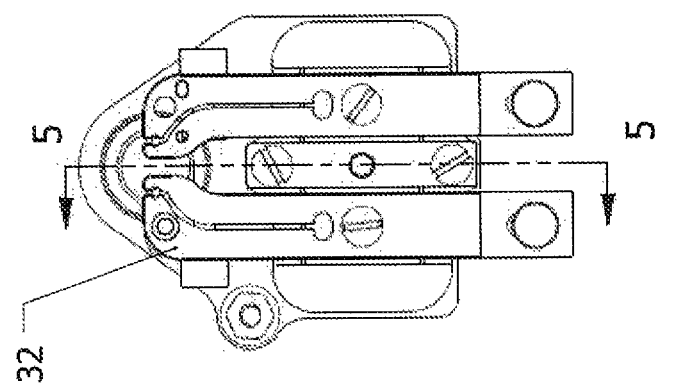
FIG. 4 illustrates an end view of the ion source of FIG. 3.

Referring to FIGS. 3, 4 and 5, the filament 30 is mounted in the filament support legs of a filament clamp assembly 32 via the parallel leads 34 in a conventional manner, such as described in US 2011/0156570.

As illustrated in FIG. 3, a mounting screw 33.passes through the filament clamp assembly 32 and into a radially extending tab of the tubular reflector 31 in order to hold the reflector 31 in place.

Referring to FIGS. 5 and 6, the reflector 31 is of cup-shape to have a flat face 35 facing the end of flattened serpentine shape of the filament 30 in spaced relation to function as an electron repeller to reflect the thermionic electrons emitted from the filament 30 towards the cathode 27. Specifically, the flat face 35 will reflect the thermionic electron emission generated on the tungsten filament 30 to the back surface of the cathode 27 enhancing the surface temperature of the cathode 27.

The thermal shield and repeller (i.e. reflector) 31 is connected to a negative bias of the filament power supply. The tri-point contact cathode 27 surface emitter is connected to a positive bias of the filament power supply. The thermal shield and reflector 31, should be installed with a gap 37 between the filament 30 and flat face 35 of the thermal shield and reflector 31.

Figure 7:
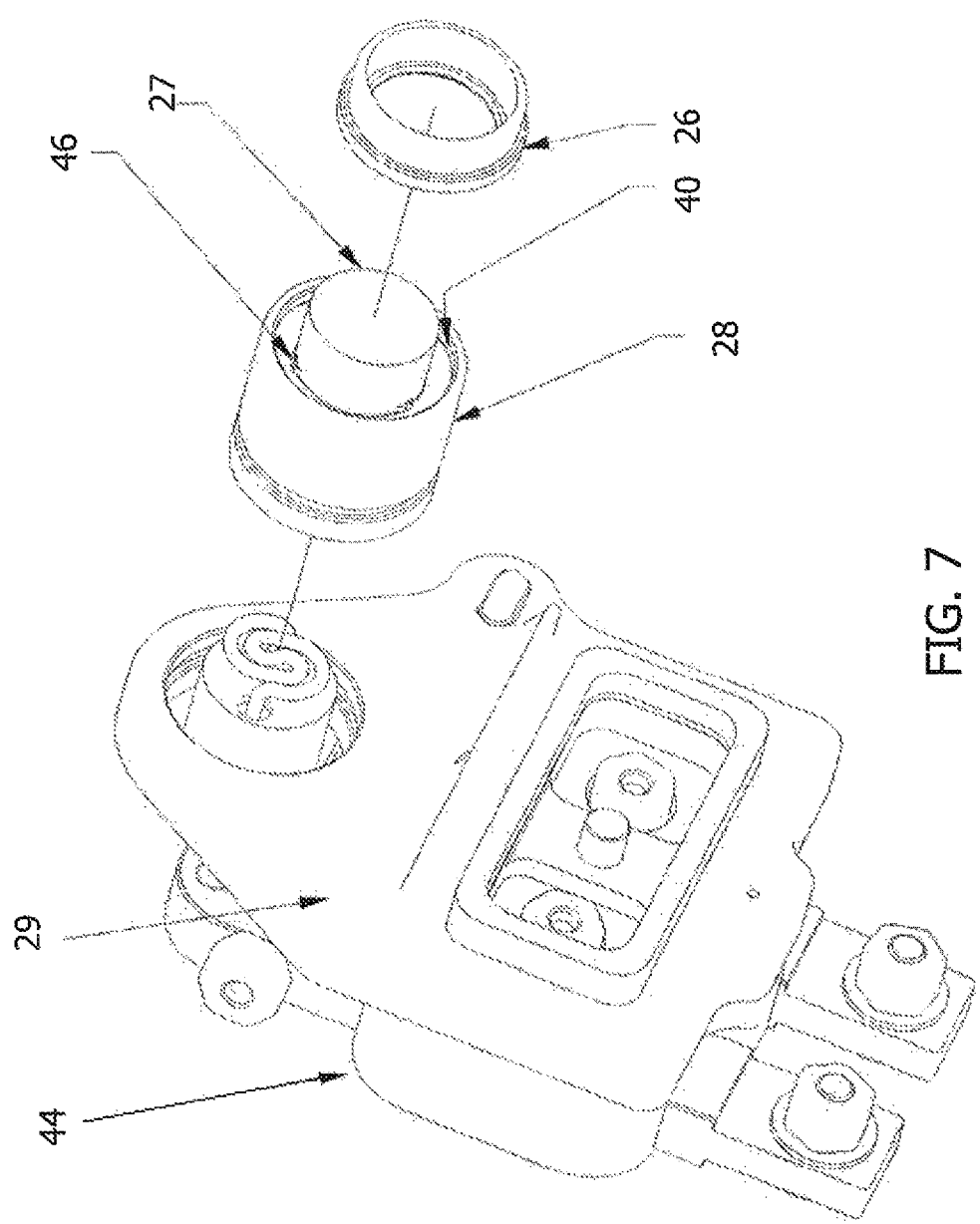
FIG. 7 illustrates an exploded view of the mounting arrangement of the cathode sub-assembly in a support plate in accordance with the invention.

FIG. 7 is a detailed exploded view of the cathode ion source assembly illustrating the tri-point contact seating to reduce the thermal loss from the cathode 27. The cylindrical thermal shield 26 will reduce the cathode side surface loss, improving the surface temperature and is threaded into an internal thread 40 of the holder 28. The cylindrical thermal shield 28 is detachably held by a male thread in the support plate 29. This allows the cathode 27 to be replaced with a new one when worn.

The graphite support plate 29 is, in turn, mounted on a ceramic insulating block 44.

Referring to FIG. 8, the cathode 27 is characterized as a stepped retainer having a stepped tri-point contact seating 27' to reduce the thermal loss from the cathode 27 and increase the cathode surface temperature.

Figure 9:
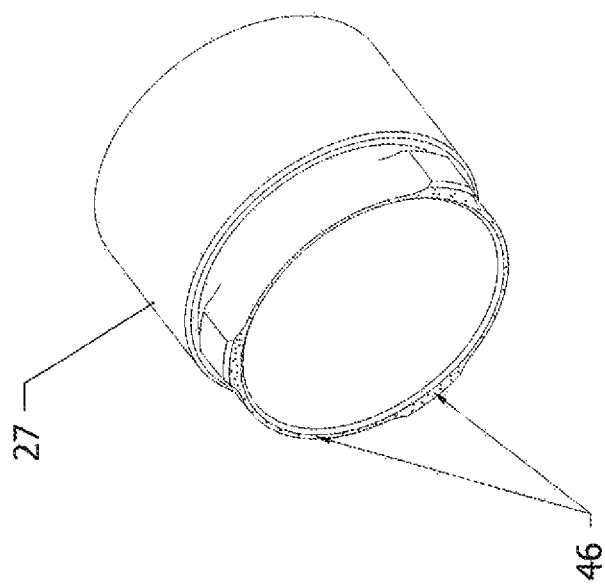
FIG. 9 illustrates a cathode of the invention with a leveled end.

Referring to FIG. 9, the cathode 27 may be characterized as a leveled retainer having a circumferential thermal contact surface 46 on the end. The leveled retainer will partially reduce the heat loss allowing to reduce the cathode retainer surface temperature.

Based on the initial test results, it was hypothesized that the cathode 27 was very hot, resulting in emission of thermal electrons and infrared radiation from the cathode 27 to the heat deflector 26. By removing the tri-point feature (leveling the contact surface), the thermal conduction from the cathode 27 via the holder 28 to the support plate 29 was increased, allowing the cathode 27 to stay below the temperature of thermal electron emission thresholds. This gave a stable bias power flow to the cathode 27.

Figure 10:
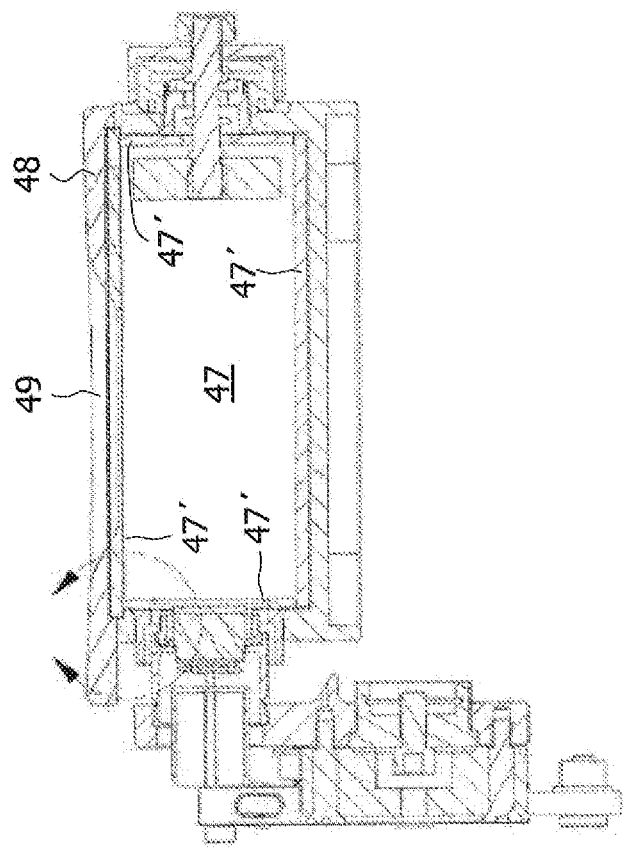
FIG. 10 illustrates a cross-sectional view of an ion source chamber fitted with a cathode sub-assembly in accordance with the invention.

Referring to FIG. 10, wherein like reference characters indicate like parts as above, the cathode sub-assembly is mounted in an arc chamber 47 of box-like shape and a cover 48 is disposed on the chamber 47 with a slit 49 (see FIG. 12) for passage of an ion beam therethrough.

As illustrated, the arc chamber 47 is lined with flat graphite heat shields 47' on the four walls, the bottom and the top. The heat shield at the top of the chamber 47 has an aperture coincident with the slit 49 in the cover 48.

Figure 11:
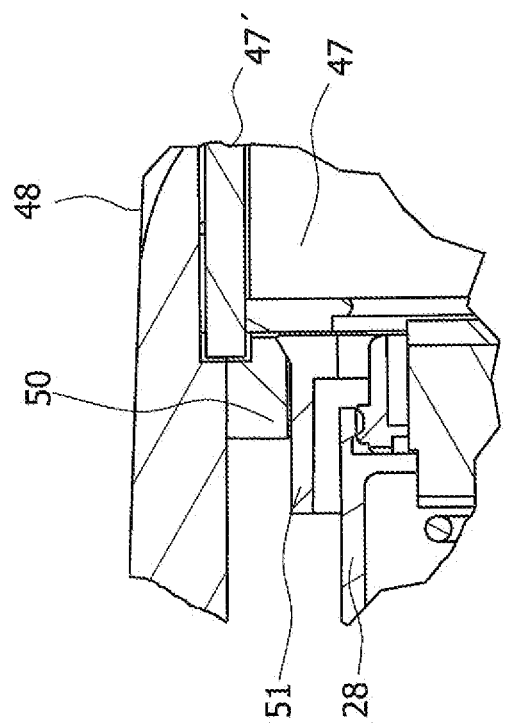
FIG. 11 illustrates an enlarged sectional view of FIG. 10.

Referring to FIG. 11, wherein like reference characters indicate like parts as above, the arc chamber 47 has a wall 50 at one end with an opening to receive a cylindrical graphite liner 51. As illustrated, the graphite liner 51 has a circumferentially tapered outer shoulder at one end in contact with the wall 50 and a cylindrical surface in circumferentially spaced relation to the wall 50 to define a gap therebetween to preserve the cathode temperature (the gain was around 50 degrees Celsius). The graphite liner 51 functions to reduce the thermal loss from the cathode 27.

As illustrated, the cathode sub-assembly assembly 26, 27, 28 is disposed within the liner 51 for emitting electrons therefrom into the chamber 47.

Figure 12:
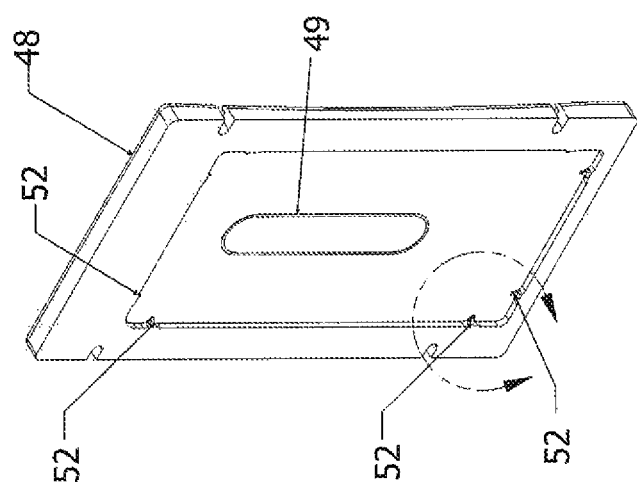
FIG. 12 illustrates a perspective view of a cover for an ion source chamber in accordance with the invention.

Referring to FIG. 12, the cover 48 has a recessed central area containing the slit 49 and a pair of raised thermal contacts 52 at each corner of the recessed central area. The recessed central area is sized to receive a graphite heat shield (not shown) on the thermal contacts 52 thereby spacing the heat shield from the cover 48.

Figure 13:
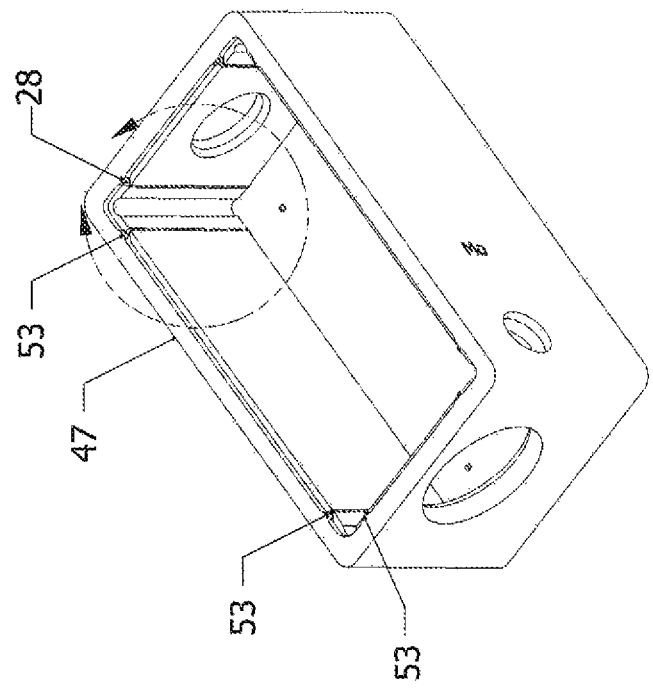
FIG. 13 illustrates a perspective view of an arc chamber body in accordance with the invention to receive the cover of FIG. 11.

Referring to FIG. 13, the arc discharge chamber 47 has a pair of raised thermal contacts 53 at each corner thereof to receive the thermal contacts of the cover.48. As illustrated, the chamber 47 is recessed in order to receive the heat shield disposed in the cover 48 with the heat shield in contact with the thermal contacts 53. In this way, the heat shield is spaced from the chamber 47

When the cover 48 is placed over the arc discharge chamber 47 with the heat shield therebetween, the thermal contacts 52, 53 provide only eight contact points between the cover 48 and chamber 47 to reduce the heat loss.

To improve the temperature inside of the arc discharge chamber 47, eight (8) vertical contact lines 55 were added to the chamber walls to space the graphite (heat shields 47' (see FIG. 10) from the walls of the chamber 47. Likewise, four contact points 56 were added to the chamber floor to space a bottom heat shield. These added contact points reduced the thermal loss and increased the internal gas temperature in the arc discharge chamber 47 by 200 degrees Celsius.

The invention thus provides an ion source cathode for ion implanters that improves the ion implanter lifetime, reduces the number of parts and reduces ion implanter downtime. Further, the invention minimizes heat loss in an ion implanter and keeps a high temperature on a cathode surface thereby improving the thermal electrons emissions to ionize the containing gases inside of an arc chamber.

What is claimed is:

1. A cathode assembly for an ion implanter comprising
   a cylindrical cathode,
   a cylindrical holder concentric to said cathode, said holder having an internal radially directed rib receiving one end of said cathode in slidable relation; and
   a cylindrical reflector threadably mounted within said holder in circumferentially spaced relation to said cathode.

2. A cathode assembly as set forth in claim 1 wherein said cathode is of solid construction and is made of tungsten.

3. A cathode assembly as set forth in claim 1 wherein said end of said cathode is circumferentially recessed relative to the remainder of said cathode and has three upstanding tabs slidably received in said holder.

4. A combination comprising
   a support plate;
   a cylindrical holder threadably mounted in and projecting from said support plate, said holder having an internal radially directed rib;
   a cylindrical cathode having one end slidably received in said rib of said holder; and
   a cylindrical reflector threadably mounted within said holder in circumferentially spaced relation to said cathode.

5. The combination as set forth in claim 4 wherein said end of said cathode is circumferentially recessed relative to the remainder of said cathode and has three upstanding tabs slidably received in said holder.

6. The combination as set forth in claim 4 further comprising a filament having an end of flattened serpentine shape facing said end of said cathode for emitting thermionic electrons onto said cathode, said filament having a pair of parallel leads extending from said end of flattened serpentine shape.

7. The combination as set forth in claim 6 further comprising a cylindrical thermal shield within said support plate and said cylindrical reflector, said thermal shield having a flat face facing said end of flattened serpentine shape of said filament in spaced relation to reflect the thermionic electrons emitted from said filament towards said cathode.

8. An ion source for generating an ion beam comprising
   an arc discharge chamber of box-like shape having a pair of opposed walls, one of said walls having an opening therein;
   a cover disposed on said chamber and having a slit for passage of an ion beam therethrough;
   a cylindrical graphite liner disposed in said opening of said one wall of said chamber, said liner having a circumferential shoulder at one end in contact with said wall of said chamber and a cylindrical surface in circumferentially spaced relation to said wall to define a gap therebetween; and a cathode assembly disposed within said liner for emitting electrons therefrom into said chamber.

9. An ion source as set forth in claim 8 wherein said cathode assembly includes a support plate;

a cylindrical holder projecting from said support plate and extending concentrically within said graphite liner, said holder having an internal radially directed rib;

a cylindrical cathode having one end slidably received in said rib of said holder; and a cylindrical reflector mounted within said holder and said graphite liner in circumferentially spaced relation to said cathode.

10. An ion source as set forth in claim 9 further comprising a filament having an end of flattened serpentine shape facing said end of said cathode for emitting thermionic electrons onto said cathode, said filament having a pair of parallel leads extending from said end of flattened serpentine shape.

11. An ion source as set forth in claim 8 further comprising a graphite heat shield between said cover and said arc discharge chamber.

12. An ion source as set forth in claim 11 wherein said cover has a recessed central area and a pair of raised electrical contacts at each corner of said recessed central area receiving said heat shield thereon and said arc discharge chamber has a pair of raised electrical contacts at each corner thereof to receive said heat shield thereon.

13. An ion source as set forth in claim 11 wherein said arc discharge chamber has a pair of raised contact ribs on each of said walls to contact a graphite heat shield thereat.

\* \* \* \* \*